(12) United States Patent
Lai et al.

(10) Patent No.: US 11,296,502 B2
(45) Date of Patent: Apr. 5, 2022

(54) ELECTROSTATIC DISCHARGE PROTECTION CIRCUIT

(71) Applicant: Taiwan Semiconductor Manufacturing Company Limited, Hsinchu (TW)

(72) Inventors: Ming-Fang Lai, Hsinchu (TW); Yi-Hsun Wu, Hsinchu (TW); Ching-Yun Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/935,769

(22) Filed: Jul. 22, 2020

(65) Prior Publication Data

US 2022/0029413 A1 Jan. 27, 2022

(51) Int. Cl.
*H02H 9/04* (2006.01)
(52) U.S. Cl.
CPC .................... *H02H 9/046* (2013.01)
(58) Field of Classification Search
CPC ........................................................ H02H 9/046
USPC ............................................................. 361/56
See application file for complete search history.

(56) References Cited

U.S. PATENT DOCUMENTS

| 6,292,343 | B1 | 9/2001 | Pequignot et al. |
| 9,013,845 | B1* | 4/2015 | Karp ................ H02H 3/202 361/56 |
| 9,025,289 | B1* | 5/2015 | Peng ................ H02H 9/046 361/56 |
| 2006/0092592 | A1 | 5/2006 | Huang |
| 2014/0029144 | A1* | 1/2014 | Kaku ................ H02H 9/046 361/56 |
| 2014/0368958 | A1* | 12/2014 | Ikimura ............. H02H 9/046 361/56 |
| 2019/0115339 | A1 | 4/2019 | Lai et al. |

FOREIGN PATENT DOCUMENTS

TW 201644130 A 12/2016

* cited by examiner

*Primary Examiner* — Dharti H Patel
(74) *Attorney, Agent, or Firm* — Foley & Lardner LLP

(57) ABSTRACT

An electrostatic discharge protection circuit includes an electrostatic discharge clamp between a first rail and a second rail, a trigger device configured to activate the electrostatic discharge clamp in response to an electrostatic discharge event, and a charge dissipation element between the first rail and the second rail to dissipate a residual charge at an input of the trigger device.

20 Claims, 6 Drawing Sheets

ELECTROSTATIC DISCHARGE PROTECTION CIRCUIT

BACKGROUND

The present disclosure relates generally to integrated circuits, and particularly to protecting integrated circuits from Electrostatic Discharge ("ESD").

Integrated circuits are widely used in a variety of applications. The reliability of these integrated circuits may be impacted by a variety of factors. One such factor may be an ESD event. An ESD event may cause a short sudden surge of electric charge within the integrated circuit, which may ultimately cause an integrated circuit to fail. Since ESD events may occur under a wide range of conditions, such as during fabrication, assembly, testing, field operations, etc., protection from ESD events may be critical for the proper operation of the integrated circuit. To protect an integrated circuit from such ESD events, ESD protection may be employed within the integrated circuit. However, present day ESD protection mechanisms have limitations in the way those mechanisms are configured and how they operate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
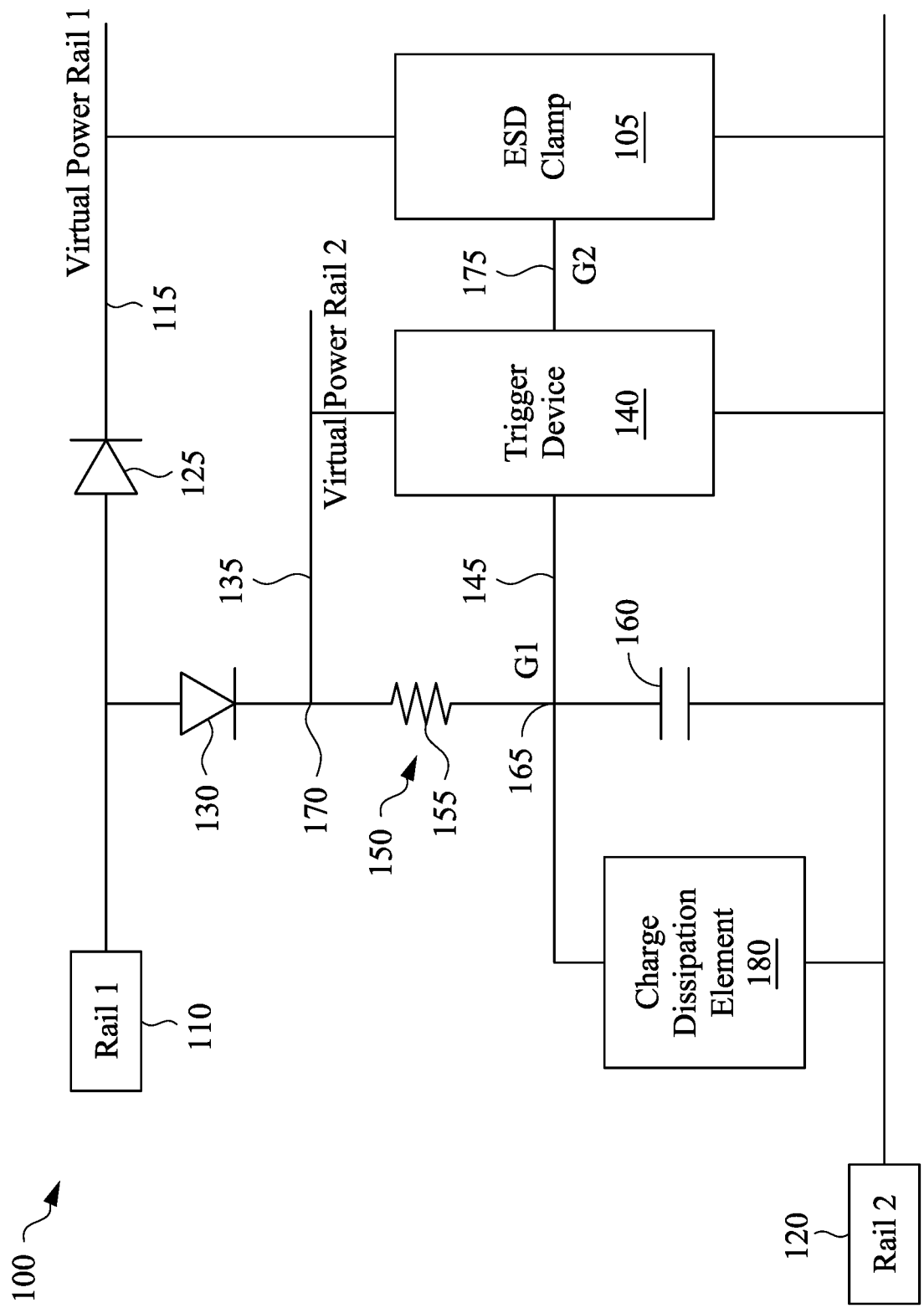
FIG. 1 is an example circuit diagram of an ESD protection circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example circuit diagram of an Electrostatic Discharge ("ESD") protection circuit 100 is shown, in accordance with some embodiments of the disclosure. The ESD protection circuit 100 may be used to protect an integrated circuit from ESD events. An "integrated circuit" may be an interconnection of electrical components such as resistors, transistors, switches, batteries, inductors, or other types of semiconductor devices configured for implementing a desired functionality. An "ESD event" may be any condition that causes or may cause an electrostatic surge or excess flow of charge that may potentially damage the integrated circuit in some way. The ESD protection circuit 100 is configured to protect the integrated circuit from such damaging ESD events.

Thus, the ESD protection circuit 100 includes an ESD clamp 105 connected between a first rail 110, and particularly between a first virtual power rail 115 of the first rail, and a second rail 120. In some embodiments, the first rail 110 may be a voltage bus connected to one or more input/output signals. In some embodiments, the second rail 120 may be a voltage bus connected to a reference voltage such as ground. Thus, in some embodiments, the first rail 110 may be at a higher potential or voltage level relative to the second rail 120. In some embodiments, the first virtual power rail 115 may be a voltage bus that is connected to the first rail 110 via a first diode 125. The first diode 125 may ensure current flow in a single direction from the first rail 110 towards the first virtual power rail 115 and ultimately to the integrated circuit being protected. Thus, in some embodiments, the integrated circuit that the ESD protection circuit 100 is configured to protect may be connected at least to the first virtual power rail 115 to supply power to that integrated circuit. In some embodiments, the integrated circuit being protected may also be connected to the second rail 120.

Further, in some embodiments, the ESD protection circuit 100 may also include a second diode 130 connected between the first rail 110 and a second virtual power rail 135. The second diode 130 may ensure current flow in a single direction from the first rail 110 towards the second virtual power rail 135 and ultimately to the integrated circuit being protected. Thus, in some embodiments, the second virtual power rail 135 may additionally or alternatively be connected to the integrated circuit being protected to provide a power supply to the integrated circuit. The second virtual power rail 135, similar to the first virtual power rail 115, may be a voltage bus.

To protect the integrated circuit from ESD events, the ESD clamp 105 may be configured to divert the excess charge (e.g., ESD current) during an ESD event between the first virtual power rail 115 and the second rail 120. For example, in some embodiments, the ESD clamp 105 may be configured to divert the ESD current from the first virtual power rail 115 to the second rail 120. Under normal operating conditions (e.g., when there is no ESD event), the ESD clamp 105 may be kept in an inactivated, deactivated, or off state. When an ESD event is detected by the ESD protection circuit 100, the ESD clamp 105 may be activated or turned on to divert the ESD current between the first virtual power rail 115 and the second rail 120. In some embodiments, the activation and inactivation of the ESD clamp 105 may be controlled by a trigger device 140.

The trigger device 140 may be connected to the ESD clamp 105. Specifically, the output of the trigger device 140 may be input into the ESD clamp 105 to activate and deactivate the ESD clamp. By varying the output of the trigger device 140, the ESD clamp 105 may be turned on or off. To vary the output of the trigger device 140, the trigger device may be connected to the second virtual power rail 135 and a trigger signal 145. Based upon a voltage level of the second virtual power rail 135 and a voltage level of the trigger signal 145, the voltage level at the output of the trigger device 140 may be varied to activate and deactivate the ESD clamp 105. For example, in some embodiments, the output of the trigger device 140 may be varied to be at a high voltage level. A voltage level may be considered a "high voltage level" if the voltage level is at or above a predetermined threshold and a "low voltage level" if that voltage level is below the predetermined threshold. The high voltage level at the output of the trigger device 140 may be configured to activate the ESD clamp 105 in some embodiments. Thus, in some embodiments, the trigger device 140 may be controlled based upon the second virtual power rail 135 and the trigger signal 145 to generate a high voltage level at the output of the trigger device during an ESD event to activate the ESD clamp 105.

In other embodiments, the ESD clamp 105 may be configured to be activated when the output of the trigger device 140 is at a low voltage level. In such embodiments, the second virtual power rail 135 and the trigger signal 145 may be configured to generate a low voltage level at the output of the trigger device 140 during an ESD event to activate the ESD clamp 105. Further, in some embodiments, a low voltage level at the output of the trigger device 140 may be configured to deactivate the ESD clamp 105. Thus, in some embodiments, when there is no ESD event, the second virtual power rail 135 and the trigger signal 145 may be configured to generate a low voltage level at the output of the trigger device to deactivate the ESD clamp 105 or keep the ESD clamp deactivated. In some embodiments, when there are no ESD events, the ESD clamp 105 may be configured to be deactivated when the output of the trigger device 140 is at a high voltage level. In such embodiments, the second virtual power rail 135 and the trigger signal 145 may be configured to generate a high voltage level at the output of the trigger device to deactivate the ESD clamp 105.

In some embodiments, the trigger device 140 may be a buffer device, a buffer inverter device, etc. In other embodiments, the trigger device 140 may be another type of suitable device configured to vary the output of the trigger device based upon the occurrence of ESD events. Further, in some embodiments, the ESD clamp 105 may be an NMOS transistor or a PMOS transistor. In other embodiments, another type of suitable device that may be selectively turned on and off and may divert ESD current from the first virtual power rail 115 to the second rail 120 during an ESD event may be used.

The voltage level of the trigger signal 145 may be varied based upon a resistor-capacitor filter 150 having a resistor 155 and a capacitor 160. The distributed resistor-capacitor filter 150 may be configured to provide an effective transient trigger signal (e.g., the trigger signal 145) to the trigger device 140 during an ESD event. In some embodiments, the resistor-capacitor filter 150 may serve as a low pass filter driven by the voltage or current from the first rail 110 and the second rail 120. The resistor-capacitor filter 150 may build a voltage drop across a first node 165 based on the voltage level at a second node 170 to set the voltage level of the trigger signal 145 to provide an effective transient trigger signal for the trigger device 140.

During normal operations (e.g., when there is no ESD event), the voltage level applied at the first rail 110 may cause the voltage level at the second node 170 to remain at a high voltage level. With the second node 170 being at the high voltage level, the voltage level at the first node 165 is also at a high voltage level, and therefore, the trigger signal 145 is also at a high voltage level. In some embodiments, the trigger device 140 may be a buffer inverter device. In such embodiments, a high voltage level of the trigger signal 145 may cause the buffer inverter of the trigger device 140 to generate a low voltage level at the output as an activation signal 175. Thus, the trigger device 140 receives the trigger signal 145 as input and generates the activation signal 175 as output. When the activation signal 175 is at a low voltage level, the ESD clamp 105 may be in a turned off state in some embodiments.

However, during an ESD event, the trigger device 140 is configured to detect the ESD event and generate a high voltage level at the activation signal 175 to activate the ESD clamp 105. For example, during an ESD event, the first rail 110 receives a surge of ESD current, increasing the voltage level of the first virtual power rail 115 and the second virtual power rail 135. The increased voltage level at the second node 170 causes the voltage level at the first node 165 to go to a low voltage level. Specifically, the resistor 155 of the resistor-capacitor filter 150 may prevent the voltage surge to pass, thereby causing the first node 165 to go to a low voltage level. When the trigger device 140 is a buffer inverter, the low voltage level at the trigger signal 145 causes the buffer inverter to generate a high voltage level signal at the activation signal 175, thereby turning on the ESD clamp 105. When the ESD clamp 105 is turned on, the ESD current may be zapped or diverted through the ESD clamp from the first virtual power rail 115 to the second rail 120, thereby effectively preventing the ESD current from passing to the integrated circuit that the ESD protection circuit 100 is configured to protect.

Thus, the operation of the trigger device 140 is based upon the voltage level at the first node 165 (e.g., the trigger signal 145) and the second node 170 (e.g., the second virtual power rail 135). In some embodiments, the resistor-capacitor filter 150 can store charge. The stored charge may be a residual charge from one or more previous cycles (e.g., a normal event or ESD event). In some embodiments, this residual charge may be stored at the first node 165 and/or the second node 135. In some embodiments, the residual charge at the first node 165 may be due to a residual charge stored at the second node 170. The residual charge at the first node 165 and/or the second node 170 may impact the proper operation of the trigger device 140. For example, in some embodiments, after an ESD event has passed, the potential or voltage level at the first node 165 and/or the second node 170 may not return to zero charge level such that a residual charge remains stored at those nodes. When the next ESD event occurs, instead of being at a low voltage level, the residual charge causes the first node 165 to be a high voltage level such that the transient voltage at the first node is at a relatively higher voltage level than the second virtual power rail 135. The high voltage level at the first node 165 may in turn cause the trigger device 140 to generate a low voltage level signal at the activation signal 175, keeping the ESD clamp 105 turned off and unable to divert the ESD current. Without being able to divert the ESD current, the integrated circuit that the ESD protection circuit 100 is configured to protect may be damaged.

Similarly, in some embodiments, due to the residual charge at the first node 165 and/or the second node 170, during a normal operation cycle, the transient response voltage level at the first node may be a low voltage level. The low voltage level at the first node 165 may cause the trigger device 140 to generate a high voltage level at the activation signal 175, thereby causing the ESD clamp 105 to activate and divert current from the first virtual power rail 115 to the second rail 120. By being turned on during normal operation, the ESD clamp 105 may impede the normal operation of the integrated circuit that the ESD protection circuit 100 is configured to protect.

To ensure the proper operation of the ESD protection circuit 100 such that the ESD clamp 105 is consistently activated during ESD events and is activated only during ESD events, the present disclosure provides a mechanism to discharge any residual charge stored at the first node 165 and/or the second node 170. For example and as shown in FIG. 1, in some embodiments, a charge dissipation element 180 may be provided between the first node 165 and the second rail 120 to discharge the potential or residual charge stored at the first node. Thus, the charge dissipation element 180 provides a charge dissipation path for the residual charge from the first node 165 to ground through the second rail 120 allowing the first node to be maintained at about zero voltage level or a potential that is close to the potential of the second rail 120. By allowing the residual charge at the first node 165 to discharge, the present disclosure provides a mechanism to ensure proper activation of the trigger device 140, which in turn ensures proper activation of the ESD clamp 105.

Figure 2:
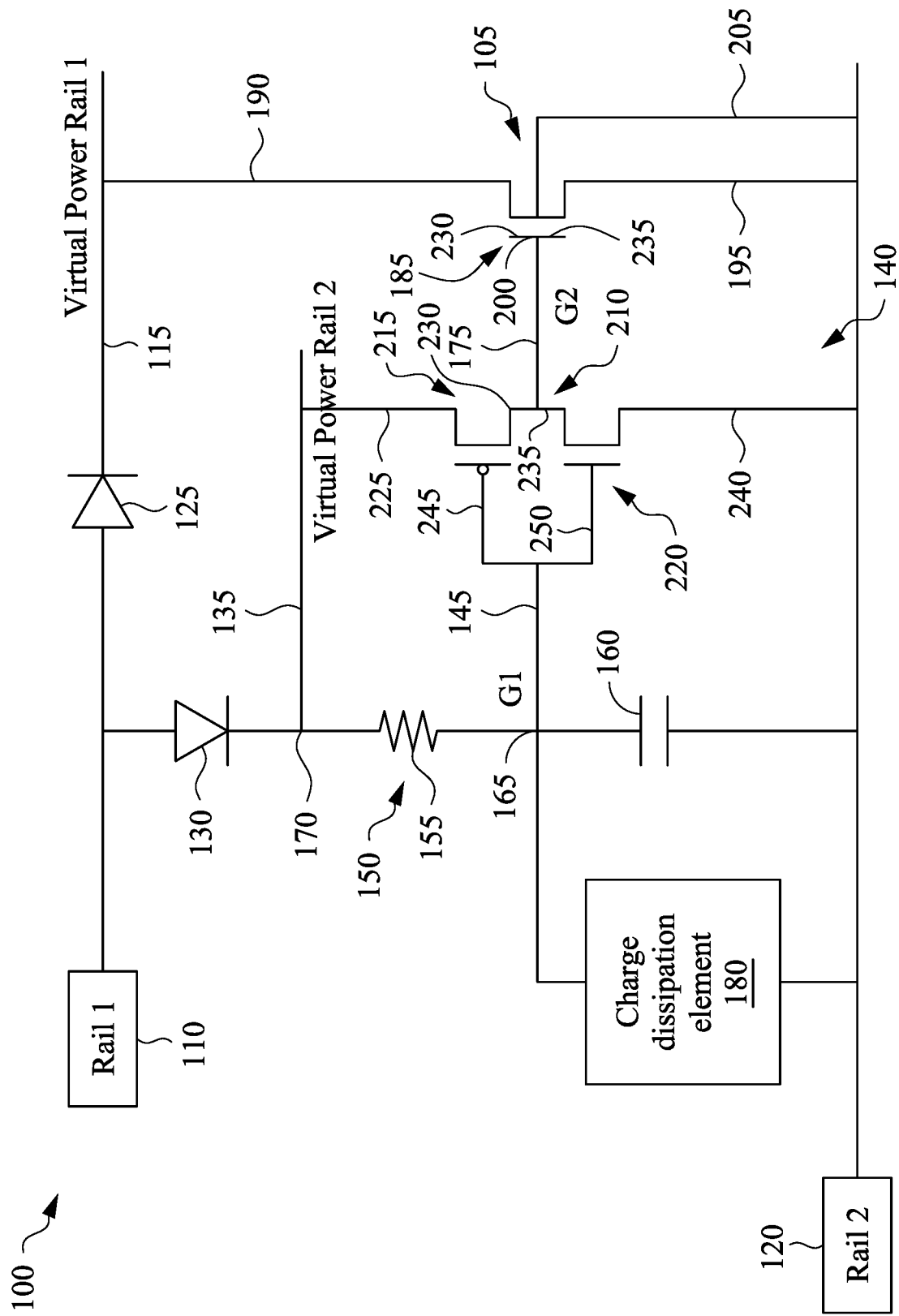
FIG. 2 is an example circuit diagram showing an example implementation of the ESD protection circuit of FIG. 1, in accordance with some embodiments.

Turning to FIG. 2, an example of the ESD clamp 105 and the trigger device 140 that may be used in the ESD protection circuit 100 is shown, in accordance with some embodiments of the present disclosure. In some embodiments, the ESD clamp 105 may include an NMOS transistor 185. A first terminal (e.g., drain terminal) 190 of the NMOS transistor 185 may be connected to the first virtual power rail 115 and a second terminal (e.g., source terminal) 195 of the NMOS transistor may be connected to the second rail 120. A third terminal (e.g., gate terminal) 200 of the NMOS transistor may be connected to the activation signal 175 and a bulk terminal 205 of the NMOS transistor may be connected to the second rail 120. In other embodiments, instead of the NMOS transistor 185, a PMOS transistor or another suitable device may be used for the ESD clamp 105.

Further, in some embodiments, the trigger device 140 may be a buffer inverter 210 having a PMOS transistor 215 and an NMOS transistor 220. A first terminal (e.g., drain terminal) 225 of the PMOS transistor 215 may be connected to the second virtual power rail 135 and a second terminal (e.g., source terminal) 230 of the PMOS transistor may be connected to a first terminal (e.g., drain terminal) 235 of the NMOS transistor 220. A second terminal (e.g., source terminal) 240 of the NMOS transistor 220 may be connected to the second rail 120. Further, in some embodiments, a third terminal (e.g., gate terminal) 245 of the PMOS transistor 215 and a third terminal (e.g., gate terminal) 250 of the NMOS transistor 220 may be connected to the trigger signal 145.

Although the buffer inverter 210 is shown as being used as the trigger device 140, in some embodiments, other types of suitable trigger devices may be used.

During an ESD event, the first rail 110 receives an ESD current, which causes the voltage level of the first virtual power rail 115 to increase, which in turn increases the voltage level at the first terminal 190 of the NMOS transistor 185. The ESD current also increases the voltage level of the second virtual power rail 135 and the second node 170. Due to the resistance provided by the resistor 155 of the resistor-capacitor filter 150, the voltage level at the second node 170 generates a low voltage level at the first node 165, which is then applied to the buffer inverter 210 via the third terminal 245 of the PMOS transistor 215 and the third terminal 250 of the NMOS transistor 220 connected to the trigger signal 145. By virtue of receiving the low voltage level signal as input, the buffer inverter 210 generates a high voltage level at the activation signal 175 to turn on the NMOS transistor 185. Upon being turned on, the NMOS transistor 185 creates a path for passing the ESD current from the first virtual power rail 115 to the second rail 120. Further, due to the presence of the charge dissipation element 180, any residual charge left at the first node 165 after the ESD event is dissipated to regulate proper activation of the buffer inverter 210 and the NMOS transistor 185 during normal operations and during the next ESD event.

The charge dissipation element 180 may be used to dissipate any pre-existing charge on the second virtual power rail 135 (as discussed below) and/or the first node 165 regardless of the cause of the pre-existing charge (e.g., residual charge) at the second virtual power rail and/or the first node. For example, as noted above, in some embodiments, the charge dissipation element 180 may be used to dissipate any residual charge after an ESD event from the first node 165 (and/or the second virtual power rail 135 as discussed below). In other embodiments, the charge dissipation element 180 may be used to dissipate pre-existing (e.g., residual charge) from the second virtual power rail 135 and/or the first node 165 that occurs due to power on or off operations, any purposeful or unexpected pre-bias action that induces a potential at the second virtual power rail and/or the first node, before an ESD event, or any other event that induces potential at those nodes. By virtue of dissipating the pre-existing (e.g., residual) charge from the second virtual power rail 135 and/or the first node 165, the charge dissipation element 180 ensures that the second virtual power rail and/or the first node are held at a potential that is close to the potential of the second rail 120. By keeping the potential of the second virtual power rail 135 and/or the first node 165 close to the potential of the second rail 120, when an ESD event occurs, the trigger device 140 is properly activated to enable the ESD clamp 105.

Figure 3:
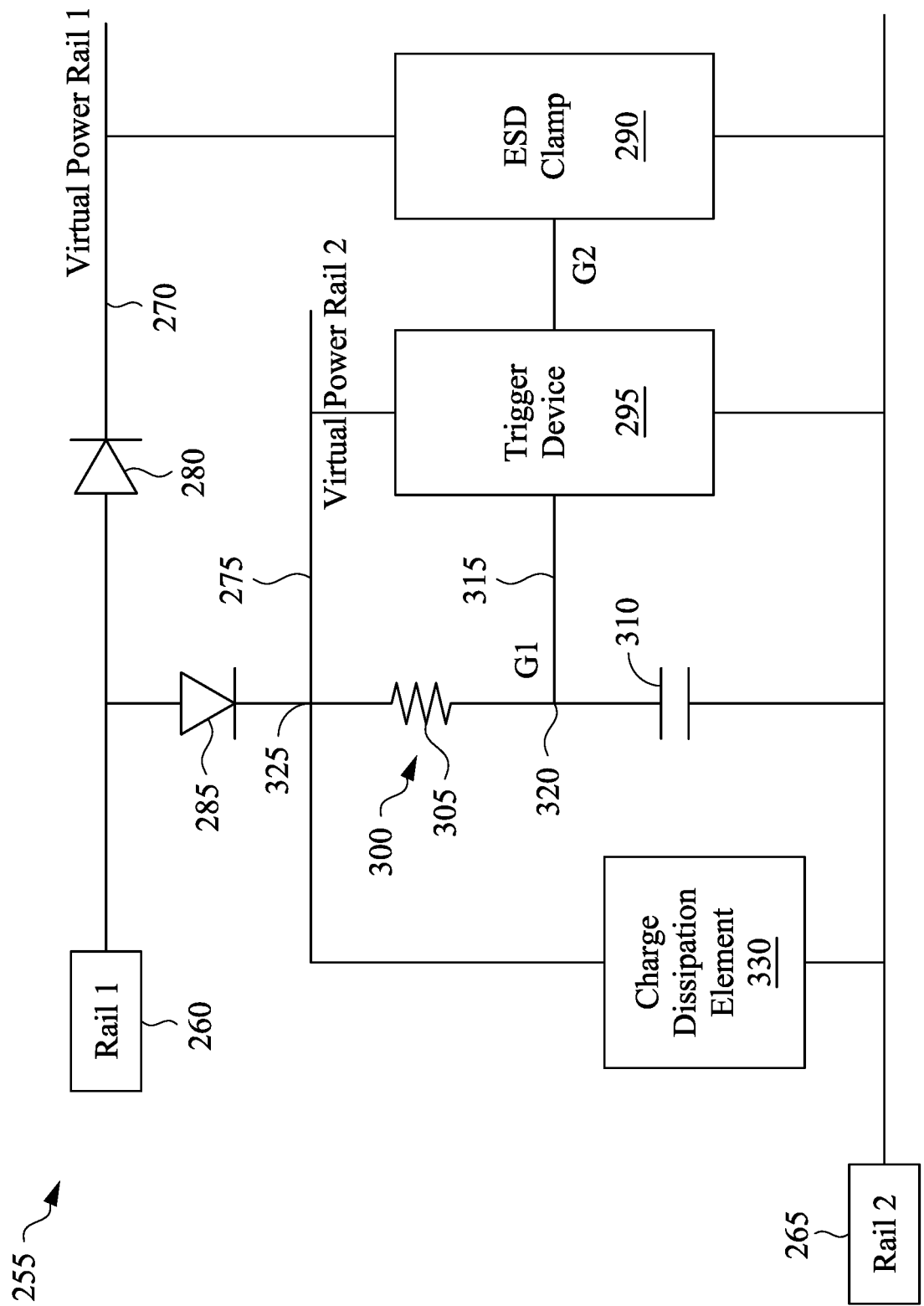
FIG. 3 is another example circuit diagram of the ESD protection circuit, in accordance with some embodiments.

Referring to FIG. 3, another example of an ESD protection circuit 255 is shown, in accordance with some embodiments of the present disclosure. The ESD protection circuit 255 is similar to the ESD protection circuit 100 except for the location of the charge dissipation element. Thus, similar to the ESD protection circuit 100, the ESD protection circuit 255 includes a first rail 260, a second rail 265, a first virtual power rail 270, and a second virtual power rail 275, each of which is similar to the first rail 110, the second rail 120, the first virtual power rail 115, and the second virtual power rail 135, respectively. A first diode 280, which is similar to the first diode 125, is placed between the first rail 260 and the first virtual power rail 270. A second diode 285, which is similar to the second diode 130, is placed between the first rail 260 and the second virtual power rail 275. The ESD protection circuit 255 also includes an ESD clamp 290 similar to the ESD clamp 105 and a trigger device 295 similar to the trigger device 140.

A resistor-capacitor filter 300 having a resistor 305 and a capacitor 310 provide a trigger signal 315 at a first node 320 to the trigger device 295. The resistor-capacitor filter 300, the resistor 305, and the capacitor 310 are similar to the resistor-capacitor filter 150, the resistor 155, and the capacitor 160, respectively. The size of the resistor 155, the resistor 305, the capacitor 160, and the capacitor 310 may vary from one embodiment to another depending upon the current level during the ESD event that is desired to be zapped. The voltage level at the first node 320 may vary based upon a voltage level at a second node 325, as discussed above. The operation of the ESD protection circuit 255 is similar to the operation of the ESD protection circuit 100, and therefore, not described again.

The ESD protection circuit 255 also includes a charge dissipation element 325 similar to the charge dissipation circuit 180. However, in contrast to the charge dissipation circuit 180, which may be connected between the first node 165 and the second rail 120, the charge dissipation circuit 330 may be connected between the second node 325 and the second rail 265. The charge dissipation element 330 may, thus, provide a path to dissipate the residual charge from the second virtual power rail 275 via the second node 325. As discussed above, in some embodiments, the voltage level at the first node 320 may be influenced by the residual charge at the second node 325. By dissipating the residual charge from the second node 325, the residual charge of the second node no longer impacts the voltage level at the first node 320.

Thus, in some embodiments, a charge dissipation element (e.g., the charge dissipation element 180) may be connected to dissipate residual charge from the first node (e.g., the first node 165, 320), while in other embodiments, a charge dissipation element (e.g., the charge dissipation element 330) may be connected to dissipate residual charge from the second node (e.g., the second node 170, 325). In some embodiments, a charge dissipation element may be connected to either the first node (e.g., the first node 165, 320) or the second node (e.g., the second node 170, 325). In other embodiments, a charge dissipation element may be connected to both the first node (e.g., the first node 165, 320) and the second node (e.g., the second node 170, 325). Thus, in some embodiments, a charge dissipation element may additionally be connected between the second node 170 and the second rail 120 of FIG. 1. Likewise, in some embodiments, a charge dissipation element may additionally be connected between the first node 320 and the second rail 265 of FIG. 3.

Figure 4B:
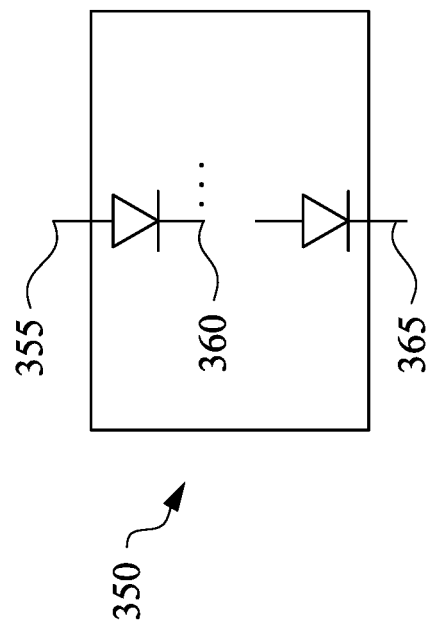
FIGS. 4A-4D are example charge dissipation elements for use in the ESD protection circuits of FIGS. 1-3, in accordance with some embodiments.
Figure 4D:
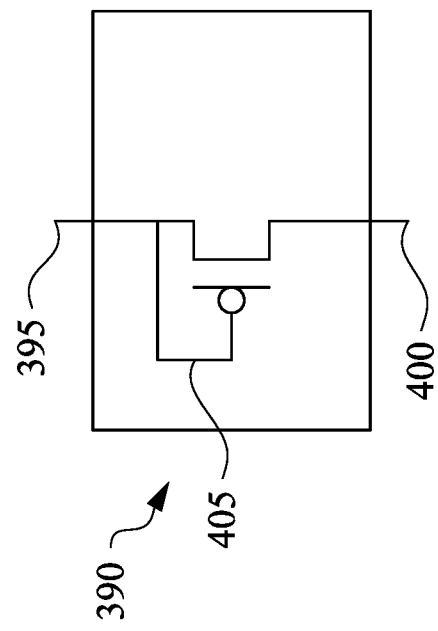
Figure 4A:
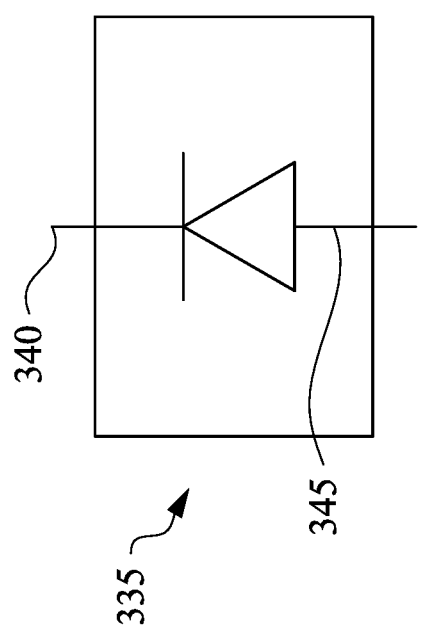

Turning now to FIGS. 4A-4D, example configurations that may be used for the charge dissipation element 180 and/or the charge dissipation element 330 are shown, in accordance with some embodiments of the present disclosure. In some embodiments and as shown in FIG. 4A, the charge dissipation element 180 and/or the charge dissipation element 330 may be configured as a reverse diode 335 in which a cathode terminal 340 is connected to the first node or the second node, and an anode terminal 345 is connected to the second rail (e.g., the second rail 120, 265). For example, in some embodiments, the charge dissipation element 180 may be configured as the reverse diode 335 such that the cathode terminal 340 of the reverse diode 335 is connected to the first node 165 and the anode terminal 345 of the reverse diode is connected to the second rail 120. Similarly, in some embodiments, the charge dissipation element 330 may be configured as the reverse diode 335 such that the cathode terminal 340 is connected to the second node 325 and the anode terminal 345 is connected to the second rail 265.

In some embodiments, and as shown in FIG. 4B, the charge dissipation element 180 and/or the charge dissipation element 330 may be configured as a series of diodes 350. The number of diodes in the series of diodes 350 may vary from one embodiment to another. In some embodiments, the number of diodes in the series of diodes 350 may be dependent upon the amount of residual charge that is desired to be dissipated. Further, in some embodiments, the string of diodes 350 may be connected such that an anode terminal 355 of the first diode in the series of diodes 350 is connected to the first node (e.g., the first node 165, 320) or the second node (e.g., the second node 170, 325), and a cathode terminal 360 of the first diode is connected to the anode terminal of the next diode (e.g., second diode) in the series. The cathode of the second diode may be connected to the anode of the third diode in the series, and so on. A cathode terminal 365 of the last diode in the series of diodes 350 may be connected to the second rail (e.g., the second rail 120, 265).

Figure 4C:
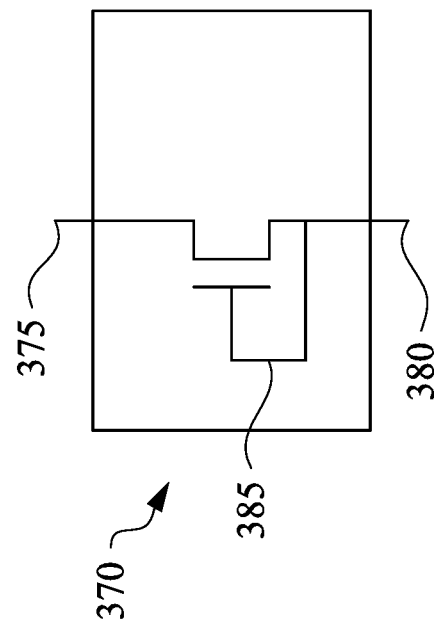

In some embodiments, and as shown in FIG. 4C, the charge dissipation element 180 and/or the charge dissipation element 330 may be configured as an NMOS diode 370. A first terminal (e.g., drain terminal) 375 of the NMOS diode 370 may be connected to the first node (e.g., the first node 165, 320) or the second node (e.g., the second node 170, 325) and a second terminal (e.g., a source terminal) 380 of the NMOS diode may be connected to the second rail (e.g., the second rail 120, 265). A third terminal (e.g., a gate terminal) 385 of the NMOS diode 370 may be connected to the second terminal 380. In other embodiments, and as shown in FIG. 4D, the charge dissipation element 180 and/or the charge dissipation element 330 may be configured as a PMOS diode 390. A first terminal (e.g., drain terminal) 395 of the PMOS diode 390 may be connected to the first node (e.g., the first node 165, 320) or the second node (e.g., the second node 170, 325) and a second terminal (e.g., a source terminal) 400 of the PMOS diode may be connected to the second rail (e.g., the second rail 120, 265). A third terminal (e.g., a gate terminal) 405 of the PMOS diode 390 may be connected to the first terminal 395.

In other embodiments, other types of devices may be used for the charge dissipation element 180 and/or the charge dissipation element 330 for draining the residual charge. In some embodiments, and particularly in those embodiments in which a first charge dissipation element is used to drain the residual charge from the first node (e.g., the first node 165, 320) and a second charge dissipation element is used to drain the residual charge from the second node (e.g., the second node 170, 325), the first and the second charge dissipation elements may both be of the same type. In other embodiments, the first charge dissipation element and the second charge dissipation element may be of different types. By connecting the charge dissipation element(s) between the first node (e.g., the first node 165, 320) and/or the second node (e.g., the second node 170, 325), any residual charge from those nodes may be drained to the second rail (e.g., the second rail 120, 265).

Figure 5:
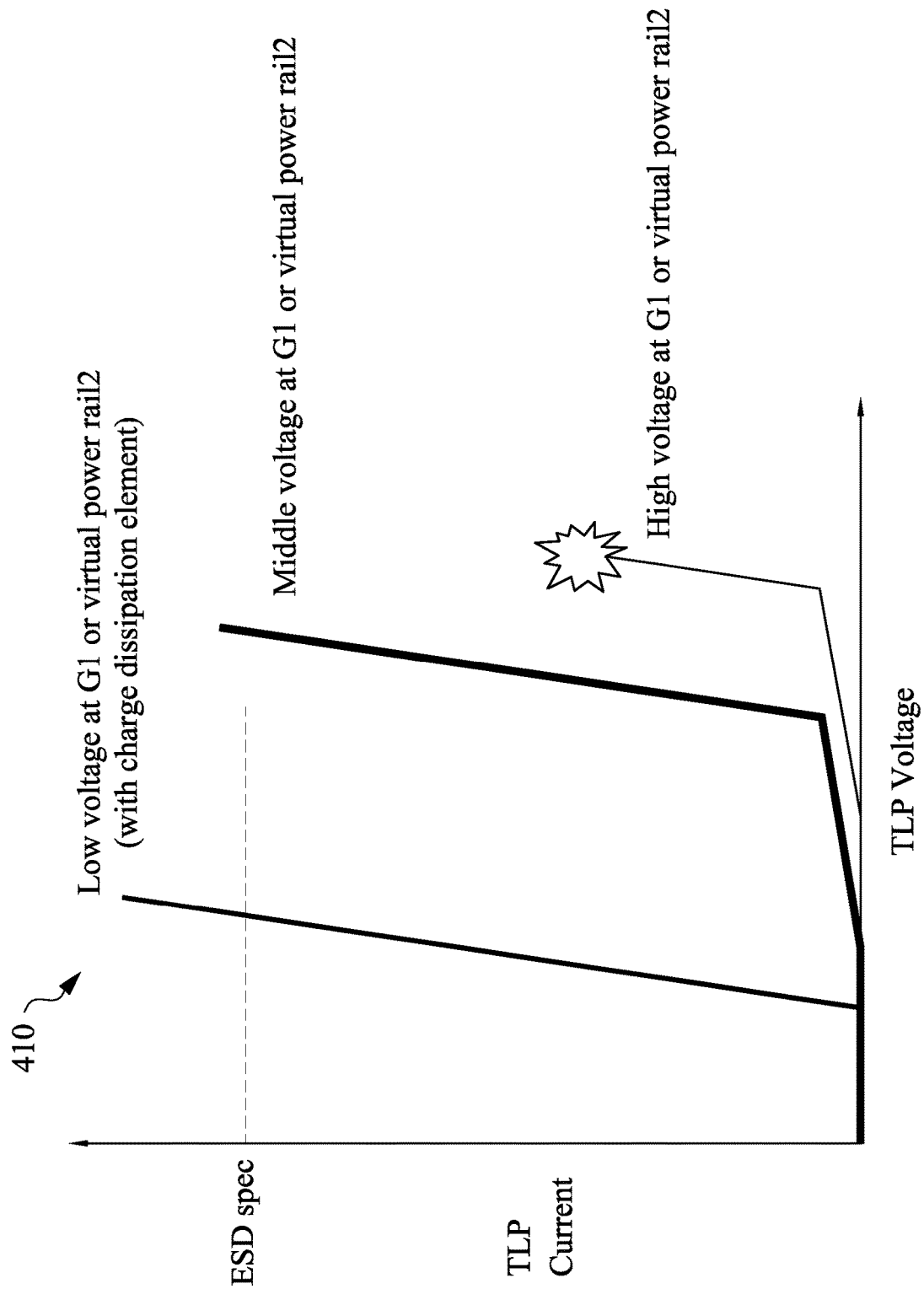
FIG. 5 is an example graph showing an example simulation of the ESD protection circuits of FIGS. 1-3 with a charge dissipation element, in accordance with some embodiments.

Referring to FIG. 5, an example graph 410 is shown, in accordance with some embodiments of the present disclosure. In some embodiments, ESD tests may be performed to monitor or test the efficacy of ESD protection circuits. Example tests may include the human body model (HBM) test, the charge device model (CDM) test, the machine model (MM) test, etc. The HBM test may be based on an ESD event caused by a charged human discharging a surge of charge into an ESD protection circuit (e.g., the ESD protection circuit 100, 255). The CDM test may be based on an ESD event where the ESD protection circuit (e.g., the ESD protection circuit 100, 255) is self-charged during the manufacturing process. The MM test may be based on a charge surge coming from a charged equipment (e.g., machine, tool, etc.). These ESD tests may be configured to provide feedback on whether an ESD protection circuit (e.g., the ESD protection circuit 100, 255) is properly operating or not. However, if the ESD protection circuit (e.g., the ESD protection circuit 100, 255) is not properly operating, such tests may damage the integrated circuit to which the ESD protection circuit is connected.

Thus, in some embodiments, a transmission line pulsing (TLP) test may be used. The TLP test may be used to test and characterize performance attributes of an ESD protection circuit (e.g., the ESD protection circuit 100, 255) without damaging the associated integrated circuit. The TLP test may emulate an ESD event and measure the response of the ESD protection circuit (e.g., the ESD protection circuit 100, 255). The graph 410 shows an example ESD test simulation of an ESD protection circuit (e.g., the ESD protection circuit 100, 255) having a charge dissipation element (e.g., the charge dissipation element 180, 330). The graph 410 plots TLP voltage on X-axis against TLP current on Y-axis. Further, the graph 410 shows three curves. The curves of the graph 410 have a lower clamping voltage compared to similar curves (not shown) simulated without a charge dissipation element (e.g., the charge dissipation element 180, 330). By using a charge dissipation element such as the charge dissipation element 180 or 330, lower clamping voltages may be passed on to the integrated circuit that the ESD protection circuit (e.g., the ESD protection circuit 100, 255) is configured to protect compared to the ESD protection circuit not having a charge dissipation element.

Figure 6:
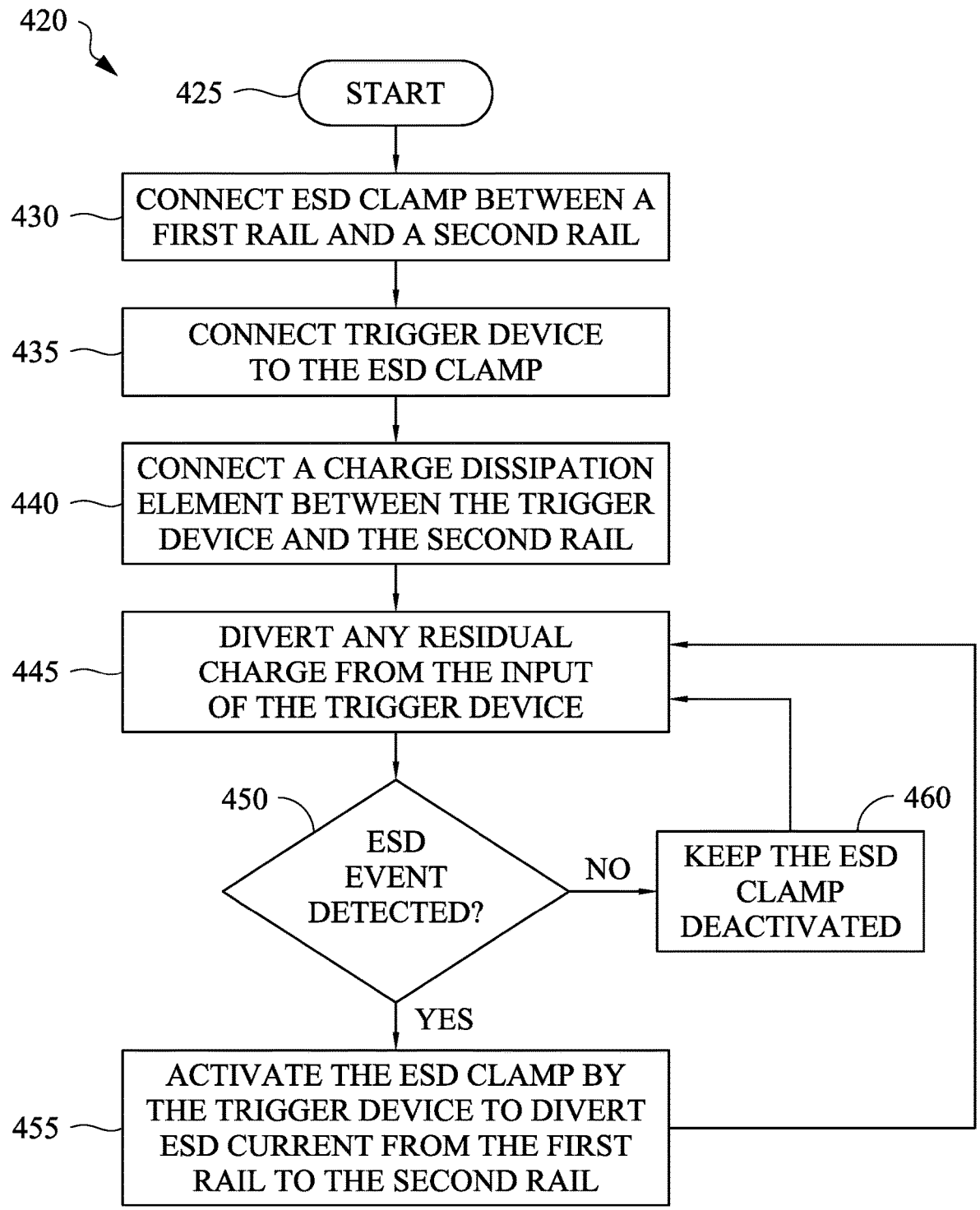
FIG. 6 is an example flowchart outlining operations for operating the ESD protection circuits of FIGS. 1-3, in accordance with some embodiments.

Referring now to FIG. 6, an example flowchart outlining operations of a process 420 for operating an ESD protection circuit (e.g., the ESD protection circuit 100, 255) is shown, in accordance with some embodiments of the present disclosure. The process 420 may include other or additional operations depending upon the embodiment. To protect an integrated circuit from an ESD event, an ESD protection circuit (e.g., the ESD protection circuit 100, 255) may be associated with the integrated circuit. To associate the ESD protection circuit with the integrated circuit, upon starting at operation 425, an ESD clamp (e.g., ESD clamp 105, 290) may be connected between a first rail (e.g., the first rail 110, 260) and a second rail (e.g., the second rail 120, 265) at operation 430. More particularly, the ESD clamp may be connected between a first virtual power rail (e.g., the first virtual power rail 115, 270) and the second rail. In some embodiments, the ESD clamp may include an NMOS transistor, a first terminal of which may be connected to the first virtual power rail, a second terminal of which may be connected to the second rail, and a third terminal of which may be connected to a trigger device (e.g., the trigger device 140, 295).

At operation 435, the trigger device (e.g., the trigger device 140, 295) is connected to the ESD clamp (e.g., ESD clamp 105, 290) such that by varying the voltage level at the output of the trigger device, the ESD clamp may be activated or deactivated. Additionally, to ensure that the trigger device itself is properly varying the voltage level at the output of the trigger device, a charge dissipation element (e.g., the charge dissipation element 180, 330) is connected to the trigger device at operation 440. As discussed above, in some embodiments, a charge dissipation element (e.g., the charge dissipation element 180) may be connected between the first node (e.g., the first node 165, 320) and the second rail (e.g., the second rail 120, 265). In other embodiments, a charge dissipation element (e.g., the charge dissipation element 330) may additionally or alternatively be connected between the second node (e.g., the second node 170, 325) and the second rail. In addition, a resistor-capacitor filter (e.g., the resistor-capacitor filter 150, 300) may be connected as discussed above.

Upon connecting the various elements of the ESD protection circuit, at operation 445, the charge dissipation element (e.g., the charge dissipation element 180, 330) diverts any residual charge that may have collected at the first node (e.g., the first node 165, 320) or the second node (e.g., the second node 170, 325) to which the charge dissipation element may be connected. By dissipating the residual charge, the charge dissipation element ensures that the ESD clamp (e.g., ESD clamp 105, 290) is not unexpectedly turned on during normal operation and is always turned on during ESD events. At operation 450, the process 420 waits for an ESD event. Upon detecting an ESD event, the process 420 proceeds to operation 455 at which the trigger device (e.g., the trigger device 140, 295) varies the output of the trigger device to activate the ESD clamp (e.g., ESD clamp 105, 290). The activation of the ESD clamp (e.g., ESD clamp 105, 290) causes the ESD clamp (e.g., ESD clamp 105, 290) to divert the ESD current from the first rail (e.g., the first rail 110, 260) to the second rail (e.g., the second rail 120, 265), thereby lowering the clamping voltage that would otherwise be delivered to the integrated circuit being protected.

On the other hand, if at the operation 450, no ESD events are detected and only normal operating voltages are detected, then the ESD clamp (e.g., ESD clamp 105, 290) is kept in a deactivated state by the trigger device (e.g., the trigger device 140, 295) at operation 460, as discussed above. The operations 455 and 460 both lead back to the operation 445 at which any residual charge from the first node (e.g., the first node 165, 320) and/or the second node (e.g., the second node 170, 325) is continually discharged to maintain the ESD clamp (e.g., ESD clamp 105, 290) in optimal operating condition.

Thus, the present disclosure provides an ESD protection circuit that effectively provides protection from ESD events to an integrated circuit. The charge dissipation element prevents the ESD clamp from unexpectedly turning on during normal operation by dissipating any residual charge that may have been stored at an input of the trigger device after an ESD event or between two normal operating cycles. The charge dissipation element also ensures that the ESD clamp does in fact turn on during an ESD event by dissipating any residual charge from the input of the trigger device before the ESD event. Thus, the charge dissipation element leads to lower clamping voltage and increased efficiency of the ESD protection circuit.

In accordance with some aspects of the present disclosure, a circuit is disclosed. The circuit includes an electrostatic discharge clamp between a first rail and a second rail, a trigger device configured to activate the electrostatic discharge clamp in response to an electrostatic discharge event, and a charge dissipation element between the first rail and the second rail to dissipate a residual charge at an input of the trigger device.

In accordance with some other aspects of the present disclosure, another circuit is disclosed. The circuit includes a first virtual power rail connected to a first rail, a second virtual power rail connected to the first rail, an electrostatic discharge clamp connected between the first virtual power rail and a second rail, and a trigger device connected to the electrostatic discharge clamp and configured to activate the electrostatic discharge clamp during an electrostatic discharge event based upon a voltage level of the second virtual power rail and the voltage level of a trigger signal. The circuit also includes a charge dissipation element connected between the second rail and at least one of the second virtual power rail or the trigger signal to dissipate residual charge from the at least one of the second virtual power rail or the trigger signal.

In accordance with yet other aspects of the present disclosure, a method is disclosed. The method includes connecting an electrostatic discharge clamp between a first rail and a second rail, connecting a trigger device to the electrostatic discharge clamp, connecting a charge dissipation element between an input of the trigger device and the second rail, and dissipating a residual charge by the charge dissipation element from the input of the trigger device to the second rail. The method also includes varying an output of the trigger device in response to an electrostatic discharge event to activate the electrostatic discharge clamp and diverting electrostatic discharge current by the electrostatic discharge clamp from the first rail to the second rail in response to the activation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   an electrostatic discharge clamp between a first rail and a second rail;
   a trigger device configured to activate the electrostatic discharge clamp in response to an electrostatic discharge event, wherein the trigger device receives a trigger signal as a first input and a second virtual power rail as a second input, wherein the trigger signal is connected to a first node, and wherein the second virtual power rail is connected to a second node; and
   a charge dissipation element between the first node and the second rail to dissipate a residual charge at the first node, wherein the charge dissipation element comprises one of a single reverse diode, a single NMOS diode, or a single PMOS diode.

2. The circuit of claim 1, further comprising a resistor-capacitor filter, the resistor-capacitor filter comprising a resistor and a capacitor, wherein the resistor is connected between the first node and the second node, and wherein the capacitor is connected between the first node and the second rail in parallel with the charge dissipation element.

3. The circuit of claim 2, wherein electrostatic discharge clamp is connected to a first virtual power rail, and wherein the first virtual power is connected to the first rail via a first diode.

4. The circuit of claim 3, wherein the second virtual power rail is connected to the first rail via a second diode, wherein the second diode is connected to the second node.

5. The circuit of claim 1, wherein the trigger device is a buffer inverter.

6. The circuit of claim 1, wherein the electrostatic discharge clamp is an NMOS transistor.

7. The circuit of claim 1, wherein the trigger device is a buffer.

8. The circuit of claim 1, wherein the electrostatic discharge clamp is a transistor comprising a first terminal connected to the first virtual power rail a second terminal connected to the second rail, and a third terminal connected to the trigger device.

9. A circuit comprising:
   a first virtual power rail connected to a first rail via a first diode;
   a second virtual power rail connected to the first rail via a second diode, wherein the second virtual power rail is connected to a second node;
   an electrostatic discharge clamp connected between the first virtual power rail and a second rail;
   a trigger device connected to the electrostatic discharge clamp and configured to activate the electrostatic discharge clamp during an electrostatic discharge event based upon a voltage level of the second virtual power rail and the voltage level of a trigger signal, wherein the trigger signal is connected to a first node; and
   a charge dissipation element connected between the second rail and the second node to dissipate residual charge from the second node, wherein the charge dissipation element comprises one of a single reverse diode, a single NMOS diode, or a single PMOS diode.

10. The circuit of claim 9, wherein the second virtual power rail is not connected to the electrostatic discharge.

11. The circuit of claim 10, further comprising a resistor-capacitor filter, wherein a resistor of the resistor-capacitor filter is connected to the second diode, wherein the second virtual power rail is connected to the second node that is between the second diode and the resistor, and wherein the first node is between the resistor and a capacitor of the resistor-capacitor filter, the capacitor being connected between the second rail and the first node.

12. The circuit of claim 9, wherein the electrostatic discharge clamp is an NMOS transistor.

13. The circuit of claim 9, wherein the trigger device is a buffer.

14. The circuit of claim 9, wherein the trigger device is a buffer inverter.

15. A method comprising:
   connecting an electrostatic discharge clamp between a first rail and a second rail;
   connecting a trigger device to the electrostatic discharge clamp, wherein the trigger device receives a trigger signal as a first input and a second virtual power rail as a second input, wherein the trigger signal is connected to a first node, and wherein the second virtual power rail is connected to a second node;
   connecting a charge dissipation element between the first node and the second rail, wherein the charge dissipation element comprises one of a single reverse diode, a single NMOS diode, or a single PMOS diode;
   dissipating a residual charge by the charge dissipation element from the first node to the second rail;
   varying an output of the trigger device in response to an electrostatic discharge event to activate the electrostatic discharge clamp; and diverting electrostatic discharge current by the electrostatic discharge clamp from the first rail to the second rail in response to the activation.

16. The method of claim 15, further comprising:

varying the output of the trigger device after the electrostatic discharge event to deactivate the electrostatic discharge clamp until a next electrostatic discharge event; and continuing to dissipate the residual charge by the charge dissipation element from the input of the trigger device to the second rail.

17. The method of claim 15, wherein the trigger device is a buffer inverter.

18. The method of claim 15, wherein the electrostatic discharge clamp is an NMOS transistor.

19. The method of claim 15, wherein the trigger device is a buffer.

20. The method of claim 15, further comprising connecting the electrostatic discharge clamp between a first virtual power rail and the second rail, wherein the first virtual power rail is connected to the first rail via a first diode.

* * * * *